(12) United States Patent
Ogami

(10) Patent No.: US 10,193,517 B2
(45) Date of Patent: Jan. 29, 2019

(54) VARIABLE FILTER CIRCUIT AND RADIO COMMUNICATION DEVICE

(71) Applicant: Murata Manufacturing Co., Ltd., Kyoto (JP)

(72) Inventor: Takashi Ogami, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 215 days.

(21) Appl. No.: 15/230,717

(22) Filed: Aug. 8, 2016

(65) Prior Publication Data
US 2016/0344092 A1   Nov. 24, 2016

Related U.S. Application Data

(63) Continuation of application No. PCT/JP2015/053173, filed on Feb. 5, 2015.

(30) Foreign Application Priority Data

Feb. 10, 2014  (JP) .................. 2014-023344

(51) Int. Cl.
| | | |
|---|---|---|
| *H01Q 1/24* | (2006.01) | |
| *H01Q 1/48* | (2006.01) | |
| *H03H 7/01* | (2006.01) | |
| *H03H 9/54* | (2006.01) | |
| *H03H 9/64* | (2006.01) | |
| *H03H 7/075* | (2006.01) | |

(52) U.S. Cl.
CPC .......... *H03H 7/0161* (2013.01); *H01Q 1/243* (2013.01); *H01Q 1/48* (2013.01); *H03H 7/075* (2013.01); *H03H 9/542* (2013.01); *H03H 9/64* (2013.01); *H03H 2210/025* (2013.01)

(58) Field of Classification Search
None
See application file for complete search history.

(56) References Cited

U.S. PATENT DOCUMENTS

| | | | |
|---|---|---|---|
| 5,291,159 A  * | 3/1994 | Vale .................. | H03H 7/12 |
| | | | 333/174 |
| 2004/0119561 A1 | 6/2004 | Omote | |
| 2005/0189997 A1 | 9/2005 | Razafimandimby et al. | |

(Continued)

FOREIGN PATENT DOCUMENTS

| | | |
|---|---|---|
| CN | 102725959 A | 10/2012 |
| JP | 2002-223147 A | 8/2002 |

(Continued)

OTHER PUBLICATIONS

Written Opinion of WO2015/119179A1 dated Apr. 21, 2015.
International search report of WO2015/119179A1 dated Apr. 21, 2015.

*Primary Examiner* — Howard Williams
(74) *Attorney, Agent, or Firm* — Pearne & Gordon LLP

(57) ABSTRACT

A variable filter circuit (10) includes a parallel arm (11) connected between a port (P3) and node (A), a series arm (12) including a resonator (Re_s1) connected in series between a port (P1) and node (A), and a series arm (13) including a resonator (Re_s2) connected in series between a port (P2) and node (A). The parallel arm (11) includes a first inductor (Lp1). The series arms (12, 13) include variable capacitors (Cp_s1, Cp_s2) connected in parallel to the resonators (Re_s1, Re_s2).

7 Claims, 6 Drawing Sheets

(56) References Cited

U.S. PATENT DOCUMENTS

| | | | |
|---|---|---|---|
| 2005/0212612 A1 | 9/2005 | Kawakubo et al. | |
| 2007/0046394 A1 | 3/2007 | Inoue et al. | |
| 2009/0174503 A1 | 7/2009 | Carpentier | |
| 2011/0199168 A1 | 8/2011 | Kadota | |
| 2012/0286900 A1 | 11/2012 | Kadota | |
| 2012/0313731 A1* | 12/2012 | Burgener | H03H 9/542 333/188 |
| 2013/0109332 A1 | 5/2013 | Aigner | |
| 2016/0204763 A1* | 7/2016 | Tani | H03H 5/12 333/188 |

FOREIGN PATENT DOCUMENTS

| | | |
|---|---|---|
| JP | 2004-173245 A | 6/2004 |
| JP | 2007-060412 A | 3/2007 |
| JP | 2007-181147 A | 7/2007 |
| JP | 4053504 B | 2/2008 |
| JP | 2009-130831 A | 6/2009 |
| JP | 2013-098991 A | 5/2013 |
| WO | 2010/058570 A1 | 5/2010 |
| WO | 2011/093449 A1 | 8/2011 |

\* cited by examiner

VARIABLE FILTER CIRCUIT AND RADIO COMMUNICATION DEVICE

This application is a continuation of International Application No. PCT/JP2015/053173 filed on Feb. 5, 2015 which claims priority from Japanese Patent Application No. JP2014-023344 filed on Feb. 10, 2014. The contents of these applications are incorporated herein by reference in their entireties.

BACKGROUND

Technical Field

The present disclosure relates to a variable filter circuit and a radio communication device including the variable filter circuit.

A known variable filter circuit is of the ladder type in which multiple basic circuits each including variable capacitors connected in parallel and in series to a resonator, such as a SAW resonator or a BAW resonator, are combined in a multistage structure (see, for example, Patent Document 1). In this variable filter circuit, an anti-resonant frequency of each of the basic circuits is adjusted by control of the variable capacitor connected in parallel to the resonator, a resonant frequency of each of the basic circuits is adjusted by control of both of the variable capacitors connected in parallel and in series to the resonator, and thus a desired band is set as a pass band.

Patent Document 1: Japanese Patent No. 4053504

BRIEF SUMMARY

In the known variable filter circuit, the pass band can be adjusted by control of the variable capacitors, but it has difficulty in obtaining desired attenuation characteristics. Specifically, it is difficult to obtain attenuation characteristics that are steep in the vicinity of a lower frequency side in the pass band. Because two variable capacitors are connected to a single resonator to make the frequencies in the pass band variable, 2×n variable capacitors are needed to have n resonators, and the total number of variable capacitors tends to increase. This results in an increased circuit size and complicated control system.

Accordingly, the present disclosure provides a variable filter circuit capable of easily obtaining attenuation characteristics that are steep in the vicinity of a lower frequency side in a pass band and having a small probability of an increased circuit size and complicated control system in a multistage structure.

A variable filter circuit according to the present disclosure includes a first series arm including a resonator connected in series between a first input/output terminal and a node, a second series arm including a resonator connected in series between a second input/output terminal and the node, and a parallel arm connected between the node and a ground connection terminal.

The parallel arm includes a first inductor connected in series between the node and the ground connection terminal. Then, the attenuation characteristics that are steep in the vicinity of the lower frequency side in the pass band are obtainable by appropriately adjusting the inductance of the first inductor.

Each of the first and second series arms includes a variable capacitor connected in parallel to the resonator. Then, the cutoff frequency on the lower frequency side in the pass band can be adjusted while increased steepness in the vicinity of the lower frequency side in the pass band in the attenuation characteristics is maintained by control of the capacitance of the variable capacitor.

To increase the number of stages in the filter in such a variable filter circuit, one series arm and one parallel arm may be added, one end of the added series arm and one end of the added parallel arm may be connected to the first input/output terminal or second input/output terminal. Accordingly, when the variable filter circuit is configured so as to have n stages, the number of series arms and that of variable capacitors are n+1. The increase in the circuit size and complication of the control system can be more suppressed, in comparison with known configurations.

The variable filter circuit according to the present disclosure may further include a second inductor (hereinafter, referred to as series inductor) connected in series to each of the resonators. When the series inductor is connected to the resonator as described above, the resonance point of the resonator can be adjusted to a further lower frequency side, and the frequency interval between the resonance point and antiresonance point can be widened.

The variable filter circuit according to the present disclosure may further include a third inductor (hereinafter, referred to as parallel inductor) connected in parallel to each of the resonators. When the parallel inductor is connected to the resonator as described above, the antiresonance point of the resonator can be adjusted to a further higher frequency side, and the frequency interval between the resonance point and antiresonance point can be widened.

When the frequency interval between the resonance point and antiresonance point can be widened as described above, the variable width of the cutoff frequency on the lower frequency side in the pass band adjustable by control of the variable capacitor can be widened.

The variable filter circuit according to the present disclosure may include a parallel inductor connected in parallel to each of the resonators and a series inductor connected in series to a circuit in which the resonator and the parallel inductor are connected in parallel. The variable filter circuit according to the present disclosure may include a series inductor connected in series to each of the resonators and a parallel inductor connected in parallel to a circuit in which the resonator and the series inductor are connected in series. When the connection configuration of series inductors and parallel inductors is changed as described above, the variable width of the cutoff frequency on the lower frequency side in the pass band can be adjusted, and the attenuation characteristics in the vicinity of the lower frequency side in the pass band can be adjusted, for example, can be made steeper.

A radio communication device according to the present disclosure may include a front-end circuit including the above-described variable filter circuit, an antenna, and a communication circuit connected to the antenna with the front-end circuit interposed therebetween. In particular, in the radio communication device, the communication circuit may support a plurality of communication bands, and a frequency at an antiresonance point in a case where the variable capacitor in at least one series arm is not disposed may be higher than an upper-end frequency on a higher frequency side in a stop band in a communication band having a highest frequency among the plurality of communication bands. A frequency at a resonance point in a case where the variable capacitor in at least one series arm is not disposed may be lower than a lower-end frequency on a lower frequency side in a stop band in a communication band having a lowest frequency among the plurality of communication bands.

It is necessary to provide each of the plurality of communication bands supported by the communication circuit with a stop band and a pass band. By setting the relationship between the plurality of communication bands and each of the resonance point and antiresonance point in each series arm as described above, the cutoff frequency on the lower frequency side in the pass band in the variable filter circuit can be adjusted to the lower frequency side in the pass band in each of the plurality of communication bands supported by the communication circuit. In the case where the stop band in the communication band is positioned in the vicinity of the lower frequency side in the pass band, large attenuation for that stop band is obtainable in the variable filter circuit.

Alternatively, in the radio communication device, the variable filter circuit may include a parallel inductor connected in parallel to each of the resonators, the communication circuit may support a plurality of communication bands, and a frequency at a sub-antiresonance point in a case where the variable capacitor in at least one series arm is not disposed may be higher than an upper-end frequency on a higher frequency side in a stop band in a communication band having a highest frequency among the plurality of communication bands.

When the parallel inductor is connected to the resonator, an antiresonance point (referred to as sub-antiresonance point) also emerges on a lower frequency side to the resonance point of the resonator. Then, in the bandpass characteristics, a second pass band is present on the lower frequency side, in addition to the first pass band on the higher frequency side. The cutoff frequency on the lower frequency side in the second pass band on the lower frequency side can also be adjusted by control of the capacitance of the variable capacitor. By setting the relationship between the plurality of communication bands and the sub-antiresonance point in each series arm as described above, the second pass band on the lower frequency side in the variable filter circuit can be adjusted so as to match with the pass bands in the plurality of communication bands supported by the communication circuit.

According to the present disclosure, attenuation characteristics that are steep in the vicinity of a lower frequency side in a pass band are obtainable, and a cutoff frequency in the pass band on the lower frequency side is adjustable by control of a variable capacitor. In addition, when the variable filter circuit is configured so as to have n stages, the number of variable capacitors is n+1. The increase in the circuit size and complication of the control system can be more suppressed, in comparison with known configurations.

DETAILED DESCRIPTION

Figure 1:
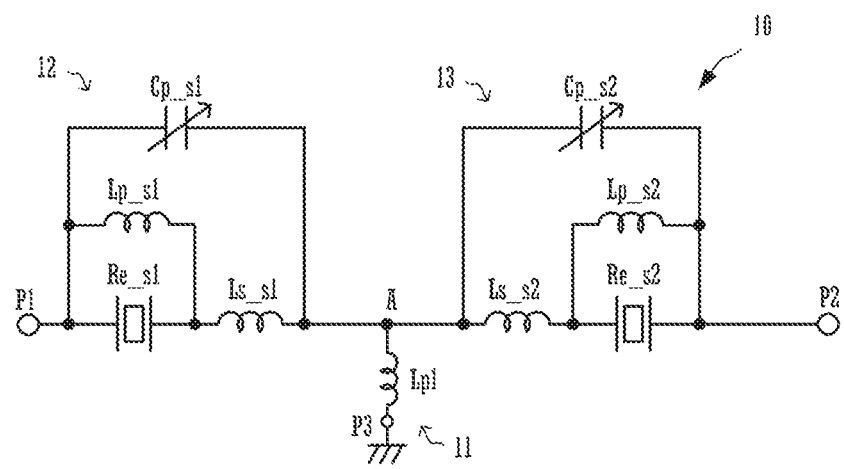
FIG. 1 is a circuit diagram of a variable filter circuit according to a first embodiment.

A plurality of modes for carrying out the present disclosure are described below with reference to the drawings by using some specific examples. The same reference numerals are used in the same places in the drawings. The embodiments are examples, and obviously, partial replacements or combinations in configurations illustrated in different embodiments can be made.

First Embodiment

FIG. 1 is a circuit diagram that illustrates a variable filter circuit 10 according to a first embodiment of the present disclosure.

The variable filter circuit 10 includes ports P1, P2, and P3, a node A, a parallel arm 11, and series arms 12 and 13. The ports P1, P2, and P3 are connected to one another with the node A interposed thereamong. The port P1 is a first input/output terminal in the variable filter circuit 10. The port P2 is a second input/output terminal in the variable filter circuit 10. The port P3 is a ground connection terminal in the variable filter circuit 10. The parallel arm 11 is connected between the node A and port P3. The series arm 12 is connected between the node A and port P1. The series arm 13 is connected between the node A and port P2. That is, the node A is in a location where one end of the parallel arm 11, and one end of the series arm 12, and one end of the series arm 13 are connected together.

The parallel arm 11 includes a first inductor Lp1. The first inductor Lp1 is disposed between the node A and port P3 and has one end connected to the node A and another end connected to the port P3.

The series arm 12 includes a resonator Re_s1, a variable capacitor Cp_s1, a series inductor Ls_s1, and a parallel inductor Lp_s1. The series inductor Ls_s1 corresponds to a second inductor in claims. The parallel inductor Lp_s1 corresponds to a third inductor in claims. The resonator Re_s1 has one end connected to the port P1. The series inductor Ls_s1 has one end connected to another end of the resonator Re_s1 and another end connected to the node A. The variable capacitor Cp_s1 is connected in parallel to a series circuit of the series inductor Ls_s1 and resonator Re_s1 and has one end connected to the port P1 and another end connected to the node A. The parallel inductor Lp_s1 is connected in parallel to the resonator Re_s1 and has one end connected to the port P1 and another end connected to a node between the series inductor Ls_s1 and resonator Re_s1.

The series arm 13 includes a resonator Re_s2, a variable capacitor Cp_s2, a series inductor Ls_s2, and a parallel inductor Lp_s2. The series inductor Ls_s2 corresponds to the second inductor in claims. The parallel inductor Lp_s2 corresponds to the third inductor in claims. The resonator Re_s2 has one end connected to the port P2. The series inductor Ls_s2 has one end connected to another end of the resonator Re_s2 and another end connected to the node A. The variable capacitor Cp_s2 is connected in parallel to a series circuit of the series inductor Ls_s2 and resonator Re_s2 and has one end connected to the port P2 and another end connected to the node A. The parallel inductor Lp_s2 is connected in parallel to the resonator Re_s2 and has one end connected to the port P2 and another end connected to a node between the series inductor Ls_s2 and resonator Re_s2.

The first inductor Lp1, resonators Re_s1 and Re_s2, variable capacitors Cp_s1 and Cp_s2, series inductors Ls_s1 and Ls_s2, parallel inductors Lp_s1 and Lp_s2 can have appropriately set element values and characteristics.

Figure 2:
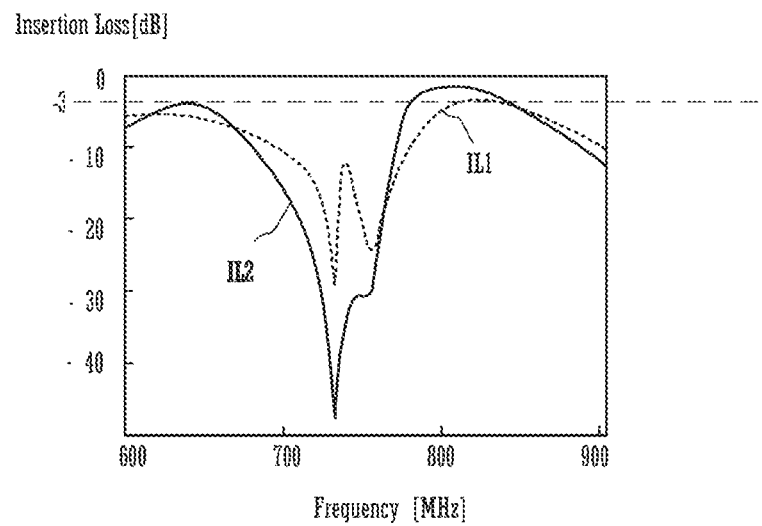
FIG. 2 is an illustration of characteristics for describing functions of a first inductor included in the variable filter circuit according to the first embodiment.

FIG. 2 is an illustration of bandpass characteristics for describing functions of the first inductor Lp1. The broken line in FIG. 2 indicates bandpass characteristics IL1 of a configuration in which the first inductor Lp1 is omitted from the variable filter circuit 10. The solid line in FIG. 2 indicates bandpass characteristics IL2 of the variable filter circuit 10, which includes the first inductor Lp1. In the bandpass characteristics IL1 and IL2 here, the values of the variable capacitors Cp_s1 and Cp_s2 are both 3.6 pF.

The bandpass characteristics IL1 of the configuration without the first inductor Lp1 and the bandpass characteristics IL2 of the configuration with the first inductor Lp1 both have attenuation poles at approximately 730 MHz and 750 MHz. For the bandpass characteristics IL1, there is no pass band whose attenuation is smaller than −3 dB. For the bandpass characteristics IL2, a pass band whose attenuation is smaller than −3 dB is present in a range of approximately 780 MHz to 840 MHz. The attenuation characteristics in the vicinity of a lower frequency side in the pass band in the bandpass characteristics IL1 are relatively gradual, whereas those in the bandpass characteristics IL2 are relatively steep. Accordingly, the variable filter circuit 10 can enhance the steepness in the vicinity of the lower frequency side in the pass band by the inclusion of the first inductor Lp1.

Figure 3A:
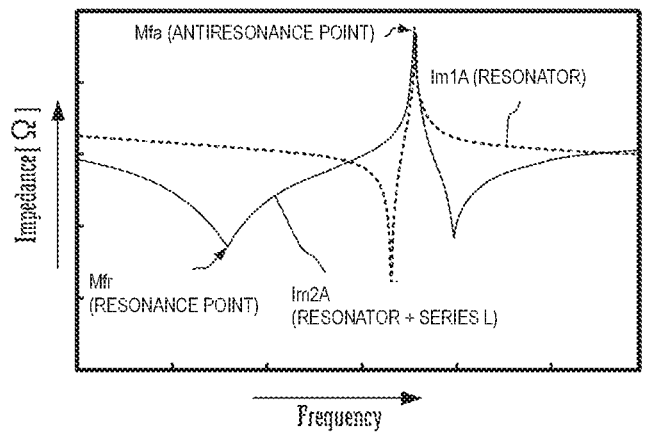
FIGS. 3A-3C include illustrations of characteristics for describing functions of a series inductor and a parallel inductor included in the variable filter circuit according to the first embodiment.

FIG. 3A is an illustration of impedance characteristics for describing the functions of the series inductor Ls_s1. The broken line in FIG. 3A indicates impedance characteristics Im1A of the resonator Re_s1 as a single unit. The solid line in FIG. 3A indicates impedance characteristics Im2A of the resonator Re_s1 connected to the series inductor Ls_s1.

For such impedance characteristics Im2A in the case where the resonator Re_s1 is provided with the series inductor Ls_s1, the frequency at an antiresonance point Mfa does not substantially differ from that for the impedance characteristics Im1A, whereas the frequency at a resonance point Mfr is displaced from that for the impedance characteristics Im1A to the lower frequency side.

Thus, the series inductor Ls_s1 in the series arm 12 has the function of moving the resonance point Mfr to the lower frequency side. The series inductor Ls_s2 in the series arm 13 has a similar function.

Figure 3B:
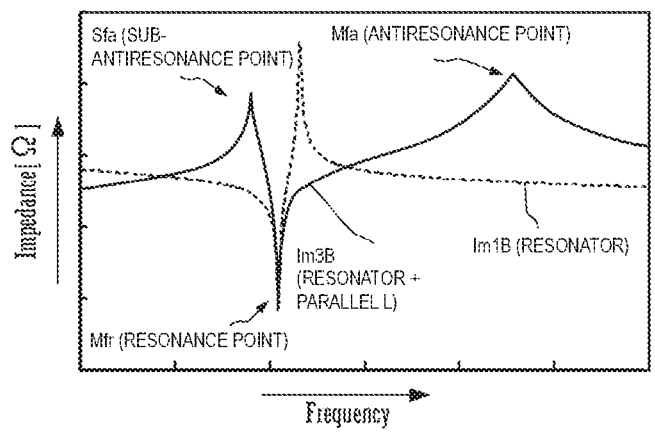

FIG. 3B is an illustration of impedance characteristics for describing the functions of the parallel inductor Lp_s1. The broken line in FIG. 3B indicates impedance characteristics Im1B of the resonator Re_s1 as a single unit. The solid line in FIG. 3B indicates impedance characteristics Im3B of the resonator Re_s1 connected to the parallel inductor Lp_s1.

For such impedance characteristics Im3B in the case where the resonator Re_s1 is provided with the parallel inductor Lp_s1, the frequency at the resonance point Mfr does not substantially differ from that for the impedance characteristics Im1B, whereas the frequency at the antiresonance point Mfa is displaced from that for the impedance characteristics Im1B to a higher frequency side.

Thus, the parallel inductor Lp_s1 in the series arm 12 has the function of moving the antiresonance point Mfa to the higher frequency side. The parallel inductor Lp_s2 in the series arm 13 has a similar function.

Figure 3C:
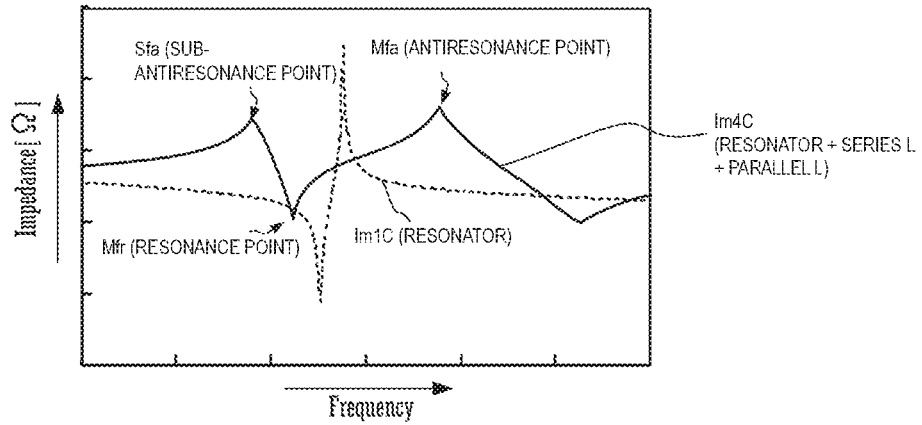

FIG. 3C is an illustration of impedance characteristics in the case where the series inductor Ls_s1 and parallel inductor Lp_s1 are disposed. The broken line in FIG. 3C indicates impedance characteristics Im1C of the resonator Re_s1 as a single unit. The solid line in FIG. 3C indicates impedance characteristics Im4C of the resonator Re_s1 connected to the series inductor Ls_s1 and parallel inductor Lp_s1.

For such impedance characteristics Im4C in the case where the resonator Re_s1 is provided with the series inductor Ls_s1 and parallel inductor Lp_s1 are disposed, the frequency at the resonance point Mfr is displaced from that for the impedance characteristics Im1C to the lower frequency side, whereas the frequency at the antiresonance point Mfa is displaced from that for the impedance characteristics Im1C to the higher frequency side.

Thus, in the series arm 12, the range between the resonance point Mfr and antiresonance point Mfa of the resonator Re_s1 can be extended by the inclusion of the series inductor Ls_s1 and parallel inductor Lp_s1. Similarly, in the series arm 13, the range between the resonance point Mfr and antiresonance point Mfa of the resonator Re_s2 can be extended by the inclusion of the series inductor Ls_s2 and parallel inductor Lp_s2.

Figure 4A:
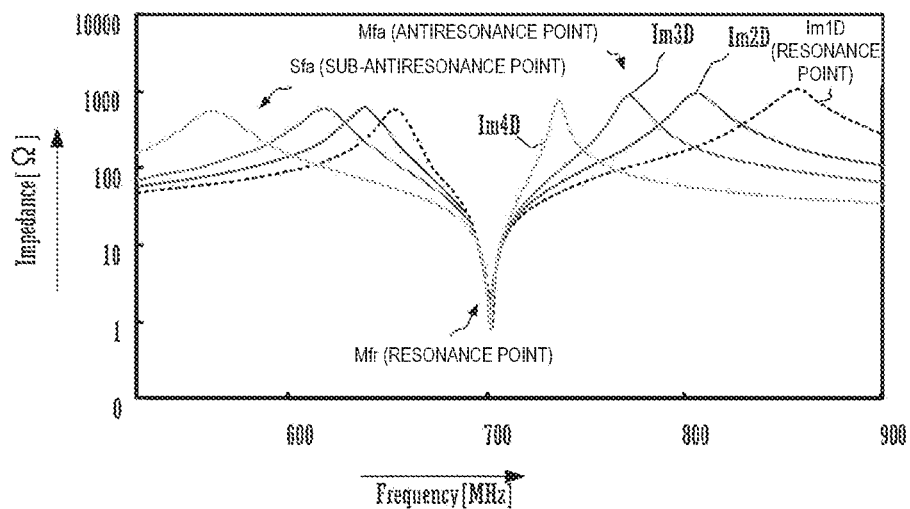
FIGS. 4A and 4B include illustrations of characteristics for describing functions of a variable capacitor included in the variable filter circuit according to the first embodiment.

FIG. 4A is an illustration of impedance characteristics for describing the functions of the variable capacitor Cp_s1. The broken line in FIG. 4A indicates impedance characteristics Im1D of the resonator Re_s1 connected to the parallel inductor Lp_s1. The solid lines in FIG. 4A indicate impedance characteristics Im2D, Im3D, and Im4D of the resonator Re_s1 connected in parallel to the parallel inductor Lp_s1 and variable capacitor Cp_s1. The impedance characteristics Im2D, Im3D, and Im4D are set such that capacitance of the variable capacitor Cp_s1 increases in the order in which they are described in the range of 1.0 pF to 10.0 pF.

For the impedance characteristics Im2D, Im3D, and Im4D in the case where the variable capacitor Cp_s1 is disposed, the frequency at the resonance point Mfr is the same as that for the impedance characteristics Im1D in the case where the variable capacitor Cp_s1 is omitted, whereas the frequencies at the antiresonance points Mfa are positioned on the lower frequency side with respect to the frequency at the antiresonance point Mfa for the impedance characteristics Im1D. The frequency at the antiresonance point Mfa decreases with an increase in the capacitance of the variable capacitor Cp_s1.

Thus, the variable capacitor Cp_s1 in the series arm 12 has the function of moving the antiresonance point Mfa of the resonator Re_s1 to the lower frequency side in accordance with the capacitance. Similarly, the variable capacitor Cp_s2 in the series arm 13 has the function of moving the antiresonance point Mfa of the resonator Re_s2 to the lower frequency side in accordance with the capacitance.

Figure 4B:
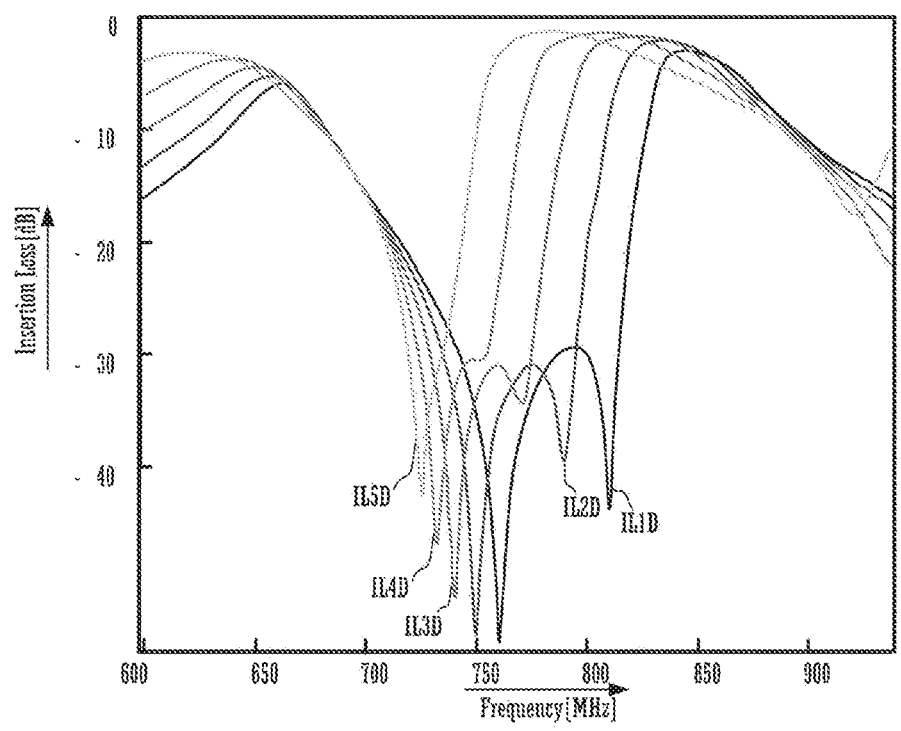

FIG. 4B is an illustration of bandpass characteristics for describing the functions of the variable capacitor Cp_s1. The solid lines in FIG. 4B indicate bandpass characteristics IL1D, IL2D, IL3D, IL4D, and IL5D of the variable filter circuit 10, which includes the variable capacitor Cp_s1. The bandpass characteristics IL1D, IL2D, IL3D, IL4D, and IL5D are set such that capacitance of the variable capacitor Cp_s1 increases in the order in which they are described in the range of 1.0 pF to 10.0 pF.

For the bandpass characteristics IL1D, IL2D, IL3D, IL4D, and IL5D, as the capacitance of the variable capacitor Cp_s1 increases, the cutoff frequency on the lower frequency side in the pass band moves toward the lower frequency side. Accordingly, the variable filter circuit 10 can adjust the cutoff frequency on the lower frequency side in the pass band by control of the variable capacitor Cp_s1.

It is to be noted that even if the capacitance of the variable capacitor Cp_s1 is controlled so as to have a significantly large value, it is impossible to adjust the cutoff frequency on the lower frequency side in the pass band to a range below a predetermined frequency on the lower frequency side. The is because it is impossible to adjust the frequency at the antiresonance point Mfa to a range below the frequency at the resonance point Mfr on the lower frequency side. The variable width of the cutoff frequency on the lower frequency side in the pass band is restricted by a range between the resonance point Mfr and antiresonance point Mfa in the case where the variable capacitor Cp_s1 is absent. However, when the series inductor Ls_s1 and parallel inductor Lp_s1 are disposed, as described above, the range between the resonance point Mfr and antiresonance point Mfa can be extended, in comparison with the case where the series inductor Ls_s1 and parallel inductor Lp_s1 are not disposed. Therefore, the variable filter circuit 10 can have an extended variable width of the cutoff frequency on the lower frequency side in the pass band.

The functions of the variable capacitor Cp_s1, series inductor Ls_s1, and parallel inductor Lp_s1 in the series arm 12 are described here. They are substantially the same as the functions of the variable capacitor Cp_s2, series inductor Ls_s2, and parallel inductor Lp_s2 in the series arm 13.

As described above, the cutoff frequency on the lower frequency side in the pass band in the variable filter circuit 10 can be adjusted by control of the variable capacitors Cp_s1 and Cp_s2 in a state where the first inductor Lp1 is disposed and the steepness in the vicinity of the lower frequency side in the pass band is enhanced and in a state where the series inductors Ls_s1 and Ls_s2 and parallel inductors Lp_s1 and Lp_s2 are disposed and the variable width of the cutoff frequency on the lower frequency side in the pass band is extended.

To increase the steepness in the filter attenuation characteristics in such a variable filter circuit 10, the number of stages of series arms and parallel arms included in the filter may be increased. For example, one parallel arm 14 and one series arm 15 may be added, and the added parallel arm 14 and series arm 15 may be connected to the port P1 or port P2. In this case, a variable capacitor Cp_s3 in the added series arm 15 may be replaced with a fixed capacitor whose capacitance value is fixed. Accordingly, in the case where the variable filter circuit 10 is configured so as to include n stages of parallel arms, because the total number of series arms and that of variable capacitors are n+1 at maximum, the increase in the circuit size and complication of the control system can be suppressed, in comparison with known configurations. The variable filter circuit 10 according to the present embodiment may include n+1 series arms and n parallel arms.

The variable filter circuit 10 can have a second pass band on a further lower frequency side, in addition to the first pass band, which is in the vicinity of a higher frequency side of the antiresonance point Mfa. The variable filter circuit 10 can use the second pass band on the lower frequency side.

For example, a sub-antiresonance point Sfa positioned on a lower frequency side to the antiresonance point Mfa emerges in each of the impedance characteristics Im3B illustrated in FIG. 3B and the impedance characteristics Im4C illustrated in FIG. 3C. In the impedance characteristics Im1D, Im2D, Im3D, and Im4D illustrated in FIG. 4A, the frequency at the sub-antiresonance point Sfa is changed by control of the capacitances of the variable capacitors Cp_s1 and Cp_s2, as in the case of the antiresonance point Mfa. Thus, in the bandpass characteristics of the variable filter circuit 10 illustrated in FIG. 4B, the second pass band on the lower frequency side is obtainable in the vicinity of (on the higher frequency side of) the sub-antiresonance point Sfa, which is on the lower frequency side to the resonance point Mfr. The cutoff frequency on the lower frequency side in the second pass band on the lower frequency side, can be adjusted by control of the capacitances of the variable capacitors Cp_s1 and Cp_s2.

Thus, the variable filter circuit 10 has the first pass band on the higher frequency side and the second pass band on the lower frequency side and can have extended pass bands that can be supported by the variable filter circuit 10 by using these two pass bands.

<<First Variations>>

Figure 5A:
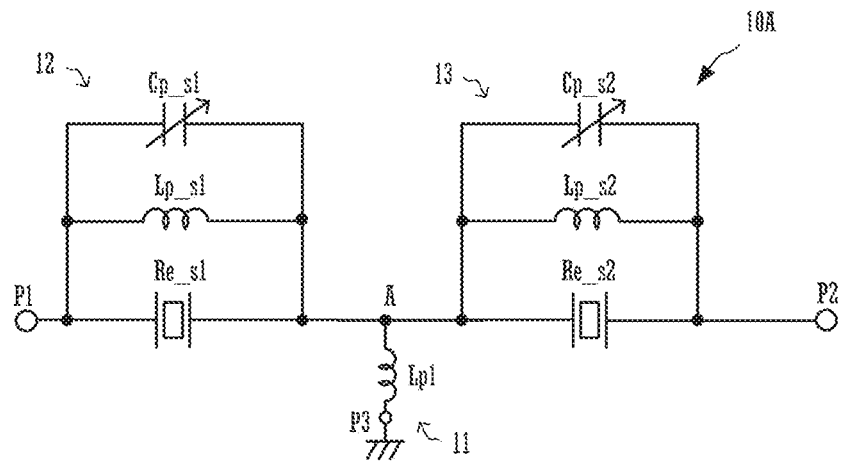
FIGS. 5A-5C include circuit diagrams according to variations of the variable filter circuit according to the first embodiment.

FIG. 5A is a circuit diagram of a variable filter circuit 10A according to a variation of the first embodiment. The variable filter circuit 10A has a configuration substantially the same as that of the above-described first embodiment, but the series inductors Ls_s1 and Ls_s2 are omitted.

Figure 6A:
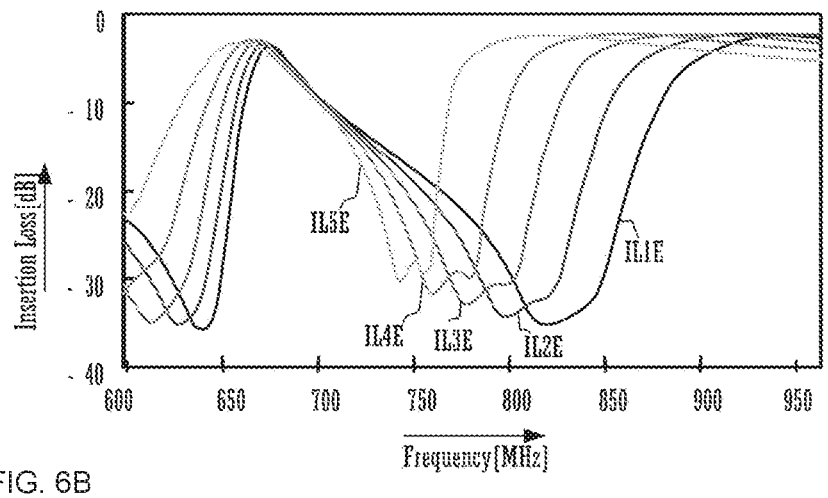
FIGS. 6A-6C include illustrations of characteristics according to the variations of the variable filter circuit according to the first embodiment.

FIG. 6A is an illustration of bandpass characteristics IL1E, IL2E, IL3E, IL4E, and IL5E of the variable filter circuit 10A. The bandpass characteristics IL1E, IL2E, IL3E, IL4E, and IL5E are set such that capacitances of the variable capacitors Cp_s1 and Cp_s2 increase in the order in which they are described in the range of 1.0 pF to 10.0 pF. In the bandpass characteristics IL1E, IL2E, IL3E, IL4E, and IL5E, as the capacitances of the variable capacitors Cp_s1 and Cp_s2 increase, the cutoff frequency on the lower frequency side in the pass band reduces. Accordingly, the cutoff frequency on the lower frequency side in the pass band in the variable filter circuit 10A can also be adjusted by control of the variable capacitors Cp_s1 and Cp_s2.

Figure 5B:
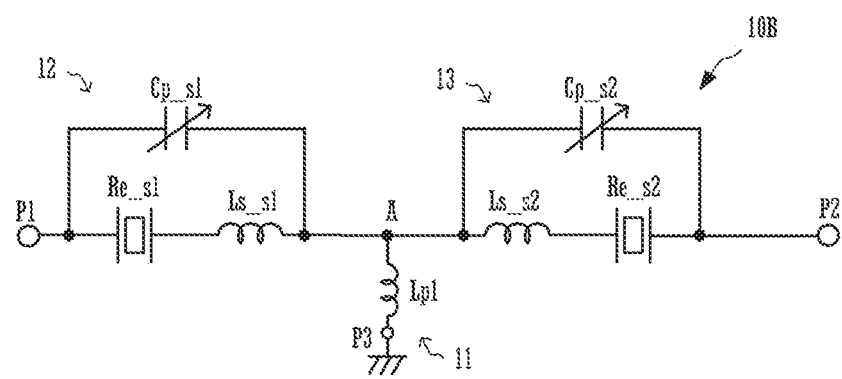

FIG. 5B is a circuit diagram of a variable filter circuit 10B according to a variation of the first embodiment. The variable filter circuit 10B has a configuration substantially the same as that of the above-described first embodiment, but the parallel inductors Lp_s1 and Lp_s2 are omitted.

Figure 6B:
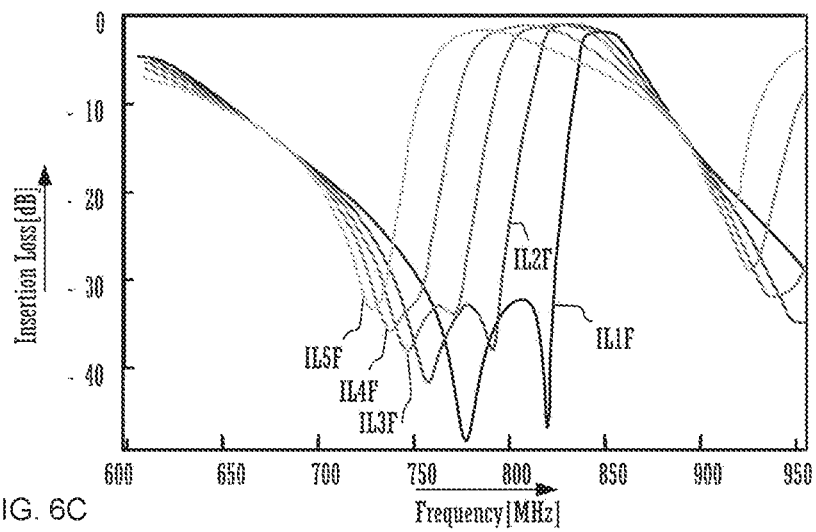

FIG. 6B is an illustration of bandpass characteristics IL1F, IL2F, IL3F, IL4F, and IL5F of the variable filter circuit 10B. The bandpass characteristics IL1F, IL2F, IL3F, IL4F, and IL5F are set such that capacitances of the variable capacitors Cp_s1 and Cp_s2 increase in the order in which they are described in the range of 1.0 pF to 10.0 pF. In the bandpass characteristics IL1F, IL2F, IL3F, IL4F, and IL5F, as the capacitances of the variable capacitors Cp_s1 and Cp_s2 increase, the cutoff frequency in the pass band on the lower frequency side reduces. Accordingly, the cutoff frequency on the lower frequency side in the pass band in the variable filter circuit 10B can also be adjusted by control of the variable capacitors Cp_s1 and Cp_s2.

Figure 5C:
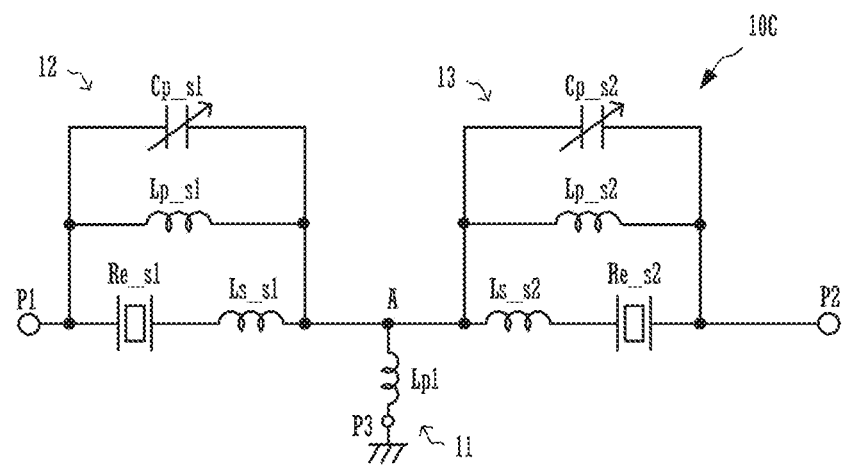

FIG. 5C is a circuit diagram of a variable filter circuit 10C according to a variation of the first embodiment. The variable filter circuit 10C has a configuration substantially the same as that of the above-described first embodiment, but first ends of the parallel inductors Lp_s1 and Lp_s2 are connected to the ports P1 and P2, respectively, and second ends of them are connected to the node A. That is, in the variable filter circuit 10C, the parallel inductors Lp_s1 and Lp_s2 are connected in parallel to a series circuit of the resonator Re_s1 and series inductor Ls_s1 and a series circuit of the resonator Re_s2 and series inductor Ls_s2, respectively.

Figure 6C:
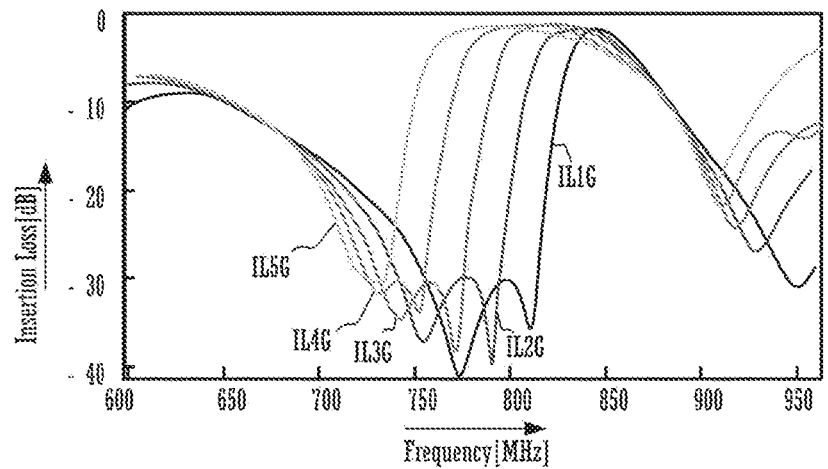

FIG. 6C is an illustration of bandpass characteristics IL1G, IL2G, IL3G, IL4G, and IL5G of the variable filter circuit 10C. The bandpass characteristics IL1G, IL2G, IL3G, IL4G, and IL5G are set such that capacitances of the variable capacitors Cp_s1 and Cp_s2 increase in the order in which they are described in the range of 1.0 pF to 10.0 pF. In the bandpass characteristics IL1G, IL2G, IL3G, IL4G, and IL5G, as the capacitances of the variable capacitors Cp_s1 and Cp_s2 increase, the cutoff frequency on the lower frequency side in the pass band reduces. Accordingly, the cutoff frequency on the lower frequency side in the pass band in the variable filter circuit 10C can also be adjusted by control of the variable capacitors Cp_s1 and Cp_s2.

The variable filter circuit according to the first embodiment may have any configurations in the above variations. In each of the configurations, the attenuation characteristics in the vicinity of the lower frequency side in the pass band can be made steeper by the inclusion of the first inductor Lp1.

Figure 7:
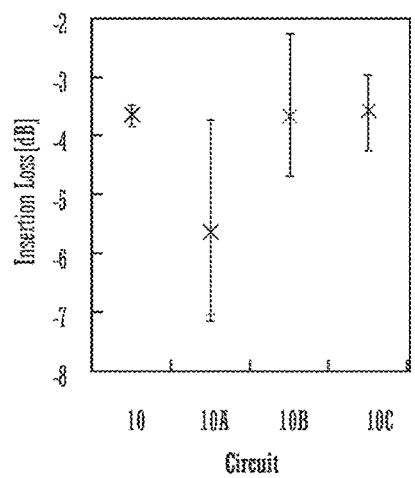
FIG. 7 illustrates comparison of insertion losses in configurations of the variable filter circuit.

Here, an insertion loss for each of the above-described circuit configurations is described. FIG. 7 illustrates comparison of insertion losses in the circuit configurations. A plurality of samples corresponding to different variable capacitors for each of the circuit configurations are extracted, and the averages of the minimum values of the insertion losses in the samples are plotted. The range of fluctuations in the minimum values of the insertion losses for each sample are indicated in a bar shape.

The variable filter circuit 10 illustrated in FIG. 1 has a relatively small average of insertion losses and very stable variations thereof, even when the variable capacitor is controlled, in comparison with the other circuit configurations. In contrast, the variable filter circuits 10A, 10B, and 10C illustrated in FIGS. 5A-5C have significantly larger fluctuations in insertion losses, in comparison with the variable filter circuit 10. The variable filter circuits 10, 10B, and 10C have relatively small averages of insertion losses, in comparison with the variable filter circuit 10A. These features of each of the circuit configurations have substantially the same tendencies even if the element values and characteristics of the circuit elements are changed.

<<Second Variation>>

Figure 8:
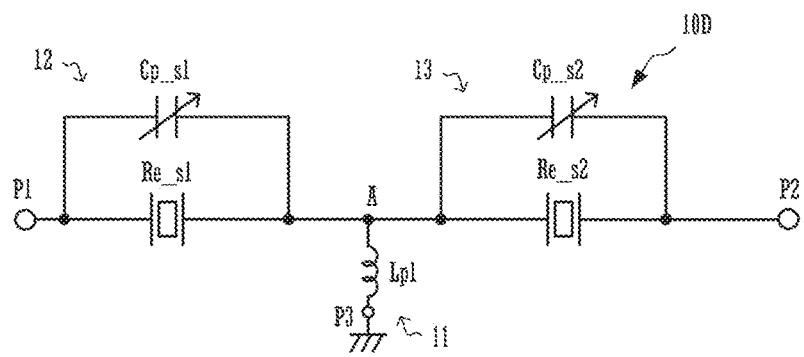
FIG. 8 is a circuit diagram according to another variation of the variable filter circuit according to the first embodiment.

FIG. 8 is a circuit diagram that illustrates another variation of the first embodiment.

A variable filter circuit 10D illustrated in FIG. 8 has substantially the same configuration as that of the above-described first embodiment, but the series inductors Ls_s1 and Ls_s2 and parallel inductors Lp_s1 and Lp_s2 are omitted.

The variable filter circuit according to the first embodiment may be configured as in this variation. Even in this configuration, the steepness in the attenuation changes in the vicinity of the lower frequency side in the pass band can be increased by the inclusion of the first inductor Lp1, in comparison with the case where the first inductor Lp1 is not disposed.

Second Embodiment

Figure 9:
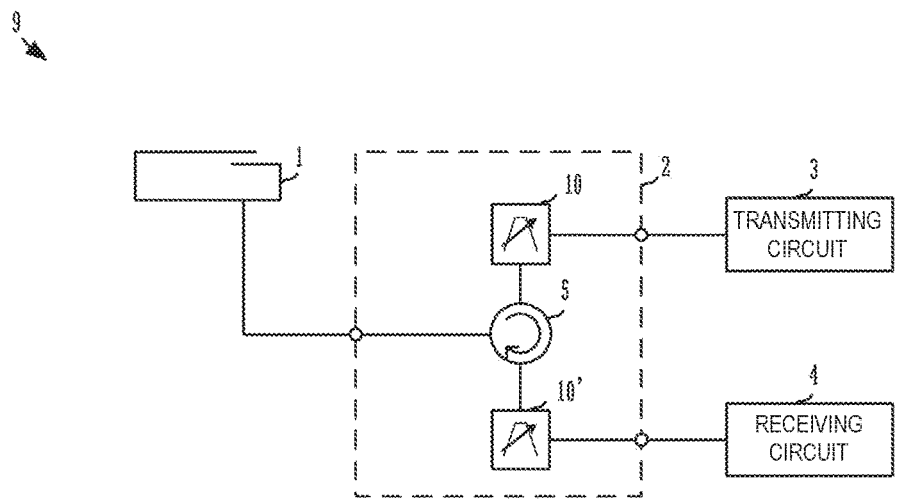
FIG. 9 is a circuit diagram of a radio communication device according to a second embodiment.

FIG. 9 is a block diagram of a radio communication device 9 according to a second embodiment.

The radio communication device 9 includes an antenna 1, a front-end circuit 2, a transmitting circuit 3, and a receiving circuit 4. The transmitting circuit 3 is configured to be able to support a plurality of communication bands in a communication system, such as LTE, and it switches a communication band to be supported and outputs a transmission signal. The receiving circuit 4 is configured to be able to support a plurality of communication bands in a communication system, such as LTE, and it switches a communication band to be supported and accepts an input of a reception signal. The front-end circuit 2 is connected between the antenna 1 and each of the transmitting circuit 3 and receiving circuit 4 and includes the variable filter circuit 10 connected to the transmitting circuit 3, a variable filter circuit 10' connected to the receiving circuit 4, and a circulator 5. The variable filter circuit 10 or variable filter circuit 10' has the same configuration as that illustrated in FIG. 1. The circulator 5 operates such that directions in which signals are conveyed are set so as to enable transmission signals to be conveyed from the transmitting circuit 3 to the antenna 1 and reception signals to be conveyed from the antenna 1 to the receiving circuit 4.

In the radio communication device 9 having the above-described configuration, the variable filter circuit 10 on the transmission side adjusts its pass band to a communication band corresponding to the transmitting circuit 3 by control of the variable capacitors. The variable filter circuit 10' on the reception side also adjusts its pass band to a communication band corresponding to the receiving circuit 4 by control of the variable capacitors. The variable filter circuit 10 on the transmission side allows signals with a transmission frequency to pass therethrough and cuts off signals with a reception frequency. The variable filter circuit 10' on the reception side allows signals with the reception frequency to pass therethrough and cuts off signals with the transmission frequency. That is, both circuits attenuate signals with frequencies on the opposite sides. In this way, the effects of transmission signals on the receiving circuit can be suppressed, and satisfactory reception sensitivity can be maintained. Accordingly, when the transmission frequency is higher than the reception frequency, the variable filter circuit 10 on the transmission side may have the same configuration as that illustrated in FIG. 1. In contrast, when the reception frequency is higher than the transmission frequency, the variable filter circuit 10' on the reception side may have the same configuration as that illustrated in FIG. 1.

To make the variable filter circuits 10 and 10' have the same configuration as that illustrated in FIG. 1, it is necessary that each of the variable filter circuits 10 and 10' satisfy a first requirement and a second requirement described below. The first requirement is that in at least one series arm, the frequency at the antiresonance point (Mfa) in the case where no variable capacitor is disposed is higher than an upper-end frequency on the higher frequency side in a stop band in a communication band having the highest frequency among a plurality of communication bands. The second requirement is that in at least one series arm, the frequency at the resonance point (Mfr) in the case where no variable capacitor is disposed is lower than a lower-end frequency on the lower frequency side in a stop band in a communication band having the lowest frequency among the plurality of communication bands. When the variable filter circuits 10 and 10' satisfy the first requirement and second requirement, all of the plurality of communication bands are included in the range between the resonance point (Mfr) and antiresonance point (Mfa), the cutoff frequency on the lower frequency side in the pass band in each of the variable filter circuits 10 and 10' can be adjusted to the lower frequency side in the pass band in each of the plurality of communication bands by control of the variable capacitors in the variable filter circuits 10 and 10'.

In the variable filter circuits 10 and 10', not the first pass band on the higher frequency side but the second pass band on the lower frequency side may be adjusted to a communication band corresponding to the transmitting circuit 3 and receiving circuit 4. In this case, a requirement for the variable filter circuits 10 and 10' is that in at least one series arm, the frequency at the sub-antiresonance point (Sfa) in the case where no variable capacitor is disposed is higher than an upper-end frequency on the higher frequency side in a stop band in a communication band having the highest frequency among a plurality of communication bands. When the variable filter circuits 10 and 10' satisfy this requirement, all of the plurality of communication bands are included in the range below the sub-antiresonance point (Sfa), the cutoff frequency on the lower frequency side in the second pass band in each of the variable filter circuits 10 and 10' can be adjusted to the lower frequency side in the pass band in each of the plurality of communication bands by control of the variable capacitors in the variable filter circuits 10 and 10'.

In this way, the second pass band in each of the variable filter circuits 10 and 10' can also be adjusted in a frequency range below the resonance point (Mfr) by control of the variable capacitors in the variable filter circuits 10 and 10'.

The present disclosure can be carried out as described above. The present disclosure can be carried out with any configurations other than the above-described embodiments when they are applicable in claims.

REFERENCE SIGNS LIST

9 . . . radio communication device
1 . . . antenna
2 . . . front-end circuit
3 . . . transmitting circuit
4 . . . receiving circuit
5 . . . circulator
10 . . . variable filter circuit
11 . . . parallel arm
12, 13 . . . series arm

The invention claimed is:

1. A variable filter circuit comprising:
a first series arm including a first resonator connected in series between a first input/output terminal and a node;
a second series arm including a second resonator connected in series between a second input/output terminal and the node; and
a parallel arm connected between the node and a ground connection terminal,
wherein the parallel arm includes a first inductor connected in series between the node and the ground connection terminal, and
at least one of the first and second series arms includes a variable capacitor connected in parallel to the first or second resonator,
wherein each of the first and second series arms includes first and second parallel inductors respectively connected in parallel to the first and second resonators and first and second series inductors respectively connected in series to circuits in which the first and second resonators and the first and second parallel inductors are respectively connected in parallel.

2. A radio communication device comprising:
a front-end circuit including the variable filter circuit according to claim 1;
an antenna; and
a communication circuit connected to the antenna with the front-end circuit interposed therebetween.

3. The communication device according to claim 2, wherein the communication circuit supports a plurality of communication bands,
when at least one series arm does not include the variable capacitor, a frequency at an antiresonance point is higher than an upper-end frequency on a higher frequency side in a stop band in a communication band having a highest frequency among the plurality of communication bands, and
when at least one series arm does not include the variable capacitor, a frequency at a resonant point is lower than a lower-end frequency on a lower frequency side in a stop band in a communication band having a lowest frequency among the plurality of communication bands.

4. The radio communication device according to claim 2, wherein
the communication circuit supports a plurality of communication bands, and
when at least one series arm does not include the variable capacitor, a frequency at a sub-antiresonance point is higher than an upper-end frequency on a higher frequency side in a stop band in a communication band having a highest frequency among the plurality of communication bands.

5. The variable filter circuit according to claim 1, wherein each of the first and second series arms includes a variable capacitor connected in parallel to the first and second resonator, respectively.

6. The variable filter circuit according to claim 1, wherein the first series inductor is connected in series to the first resonator between the first resonator and the node, and the second series inductor is connected in series to the second resonator between the second series resonator and the node.

7. A variable filter circuit comprising:
a first series arm including a first resonator connected in series between a first input/output terminal and a node;
a second series arm including a second resonator connected in series between a second input/output terminal and the node; and
a parallel arm connected between the node and a ground connection terminal,
wherein the parallel arm includes a first inductor connected in series between the node and the ground connection terminal, and
at least one of the first and second series arms includes a variable capacitor connected in parallel to the first or second resonator,
wherein the first series arm includes a first series inductor connected in series to the first resonator, and the second series arm includes a second series inductor connected in series to the second resonator, and wherein the first series arm includes a first parallel inductor connected in parallel to the first resonator and the first series inductor, and the second series arm includes a second parallel inductor connected in parallel to the second resonator and the second series inductor.

* * * * *